United States Patent
Bassett et al.

(10) Patent No.: US 6,788,035 B2
(45) Date of Patent: Sep. 7, 2004

(54) SERIAL BUS CONTROL METHOD AND APPARATUS FOR A MICROELECTRONIC POWER REGULATION SYSTEM

(75) Inventors: Keith Bassett, Torrance, CA (US); Tim Ng, Monterey Park, CA (US); Nicholas Steffen, Redondo Beach, CA (US); Kenneth Ostrom, Palos Verdes Estates, CA (US); Benjamin Tang, Hawthorne, CA (US); Robert Carroll, Andover, MA (US)

(73) Assignee: Primarion, Inc., Tempe, AZ (US)

( * ) Notice: Subject to any disclaimer, the term of this patent is extended or adjusted under 35 U.S.C. 154(b) by 0 days.

(21) Appl. No.: 10/167,911

(22) Filed: Jun. 12, 2002

(65) Prior Publication Data

US 2003/0090255 A1 May 15, 2003

Related U.S. Application Data

(63) Continuation-in-part of application No. 10/104,039, filed on Mar. 22, 2002
(60) Provisional application No. 60/297,679, filed on Jun. 12, 2001.

(51) Int. Cl.[7] .............................................. G05F 1/618
(52) U.S. Cl. ...................................... 323/272; 323/274
(58) Field of Search ............................... 323/225, 226, 323/272, 273, 276, 274, 282, 288, 285; 361/111, 18, 92, 228, 189, 93.1, 93.2; 710/108, 109; 363/35, 37, 38, 39, 40, 41, 72, 56.02, 88; 307/66, 83, 17, 29

(56) References Cited

U.S. PATENT DOCUMENTS

| | | | |
|---|---|---|---|
| 3,675,114 A | | 7/1972 | Nercessian |
| 4,356,542 A | * | 10/1982 | Bruckner et al. ............. 363/26 |
| 4,675,770 A | | 6/1987 | Johansson |
| 4,695,737 A | * | 9/1987 | Rabon et al. .................. 307/31 |
| 5,210,443 A | * | 5/1993 | Kugler ......................... 307/17 |
| 5,563,838 A | | 10/1996 | Mart et al. |
| 5,574,697 A | | 11/1996 | Manning |
| 5,629,608 A | | 5/1997 | Budelman |
| 5,675,480 A | * | 10/1997 | Stanford ...................... 363/55 |
| 5,717,319 A | | 2/1998 | Jokinen |
| 5,768,118 A | * | 6/1998 | Faulk et al. .................. 363/72 |
| 5,777,383 A | | 7/1998 | Stager et al. |
| 5,818,780 A | | 10/1998 | Manning |
| 5,835,979 A | | 11/1998 | Hiraki et al. |
| 5,852,359 A | | 12/1998 | Callahan, Jr. et al. |
| 5,864,225 A | | 1/1999 | Bryson |
| 5,914,873 A | | 6/1999 | Blish, II |
| 5,938,769 A | | 8/1999 | Hu |
| 5,945,941 A | | 8/1999 | Rich, III et al. |
| 6,009,034 A | | 12/1999 | Manning |
| 6,014,299 A | | 1/2000 | Hsieh |
| 6,028,417 A | | 2/2000 | Ang et al. |
| 6,049,973 A | | 4/2000 | Frank, Jr. et al. |
| 6,271,604 B1 | | 8/2001 | Frank, Jr. et al. |
| 6,297,955 B1 | | 10/2001 | Frank, Jr. et al. |

FOREIGN PATENT DOCUMENTS

EP          0 922 636          6/1999

* cited by examiner

Primary Examiner—Rajnikant B. Patel
(74) Attorney, Agent, or Firm—Theodore E. Galanthay

(57) ABSTRACT

A serial bus control method, apparatus, and system for transmitting signals between a master controller and a slave controller associated with a power regulator are disclosed. The serial bus control scheme allows for information to be written to or read from individual regulators or be written to read from all regulators that are coupled to the master controller.

25 Claims, 7 Drawing Sheets

SERIAL BUS CONTROL METHOD AND APPARATUS FOR A MICROELECTRONIC POWER REGULATION SYSTEM

CROSS-REFERENCE TO RELATED APPLICATIONS

This application claims priority to, and the benefit of, U.S. Provisional Patent Application Serial No.: 60/297,679, entitled "SERIAL BUS CONTROL SCHEME FOR A POWER REGULATOR SYSTEM" and filed on Jun. 12, 2001; and is a continuation in part of U.S. Non-Provisional Patent Application Serial No.: 10/104,039, entitled "POWER REGULATION SYSTEM, APPARATUS, AND METHOD FOR PROVIDING REGULATED POWER TO A MICROELECTRONIC DEVICE" and filed on Mar. 22, 2002 which are hereby incorporated by reference in their entirety.

TECHNICAL FIELD

The present invention generally relates to microelectronic power regulation systems and components. More particularly, the invention relates to a serial bus control scheme suitable for providing communication between various portions of a microelectronic power regulation system.

BACKGROUND INFORMATION

Microelectronic power regulation systems generally include a power regulator configured to supply a desired, regulated power to a microelectronic device such as microprocessors, microcontrollers, memory devices, and the like. The system may also include capacitors located near and/or packaged with the microprocessor to supply additional charge during the operation of the microprocessor. Such power regulation systems are configured so that the power regulator (e.g., a switching regulator such as a Buck regulator) provides nominal operating power to the microprocessor and the capacitors supply charge to compensate for transient power demands that result from operation of the microelectronic device. Such transient power demands may occur, for example, when several transistors of the microprocessor switch in the same direction at approximately the same time—e.g., when a portion of the device is powered off to conserve power or a portion of the device is activated.

As the speed and integration of microprocessors increase, the use of power regulation systems that only employ decoupling capacitors to compensate for or regulate transient power demands becomes increasingly problematic. For example, the number and/or size of the capacitors required to account for transient events generally increases as the integration of the microprocessor increases. The capacitors take up a relatively large amount of space on the package and can be relatively expensive. In addition, as the speed and the performance of the microprocessor increases, the severity (e.g., the amplitude) of the transient power demands and the frequency of the events tend to increase. Further, the microelectronic devices often become more sensitive to degraded power waveforms, which result from transient events, as the integration and speed of the devices increase. Capacitors within typical power regulation systems may be unable to adequately regulate such sever transient power demands. If not regulated or filtered, transient power events may result in a power or ground "spike" or "bounce"—i.e., momentary voltage levels below or above the nominal operating voltage of the microelectronic device, which in turn induces bit errors in digital logic of the microelectronic device through degraded noise margin and supply-induced timing violations. Accordingly, improved apparatus for responding to transient events that result during operation of a microelectronic device are desired.

Furthermore, although typical Buck regulators are generally suitable for controlling power to some microprocessors, such regulators are not well suited to supply relatively high current (e.g., greater than about 30 amps) at relatively high speed (e.g., greater than about 100 kHz). One reason that Buck regulators have difficulty supplying high current at high speed to the microprocessor is that the regulator is configured to supply a single core operating voltage (Vcc) to the entire microprocessor. Supplying power from a single source and distributing the power to a limited number of locations of the microprocessor may be problematic in several regards. For example, various portions of the microprocessor may operate more efficiently at different amounts of power—e.g. at different current and/or voltage levels. To compensate for the different power requirements, the microprocessor may require additional components and integration to step the power up or down as needed. Such additional components and integration may undesirably add to the cost and complexity of the microprocessor and systems including the microprocessor. Further, supplying all or most of the power from a single regulated power source requires a relatively large power regulator, which is generally inherently slow to respond to changes in power demands.

Another problem associated with supplying the same operating power to a limited number of locations of a microprocessor is that microprocessor wiring schemes configured to distribute the regulator power to the microprocessor are generally complex and include relatively long wiring sections to supply power to sections of the device located away from the input source of the power. The relatively long wiring sections may cause delay and undesirable signal degradation or loss of the transmitted power. Accordingly, improved methods and apparatus for providing power to a plurality of portions of a microelectronic device and to supply various amounts of power to a plurality of locations on the microprocessor are desired.

SUMMARY OF THE INVENTION

The present invention provides improved apparatus and techniques for transmitting signals between portions of a microelectronic power regulation system.

While the way in which the present invention addresses the disadvantages of the prior art will be discussed in greater detail below, in general, the present invention provides a power regulation system capable of detecting a transient event, communicating between portions of the power system, and responding to the sensed transient power event.

In accordance with one exemplary embodiment of the present invention, a power regulation system in accordance with the present invention includes one or more secondary or transient suppression regulators coupled to a microelectronic device and configured to respond to or account for high-frequency transient power demands and a controller coupled to at least one of the secondary regulators. In accordance with one embodiment of the invention, the controller is configured to periodically poll the secondary regulator and to write or send information to the secondary regulator based on the polled information.

In accordance with one embodiment of the invention, a secondary regulator includes a slave controller configured to receive information from a master controller and to send information to the master controller. In accordance with various aspects of this embodiment, a serial interface protocol is used to communicate between the master controller and the secondary regulator. In accordance with various aspects of this embodiment of the invention, the protocol supports one or more of the following modes: write, broadcast write, output enable, broadcast output enable, read status, broadcast read status, and read command. In accordance with a further aspect of this embodiment, each transmission from the controller includes address information, including a unique address for each secondary regulator or a broadcast address.

In accordance with further embodiments of the invention, a serial communication bus includes a pair of transmission lines: a serial clock line and a serial data line. The transmission lines couple one or more secondary regulators to a master controller.

In accordance with various embodiments of the invention, each transient suppression regulator is coupled to a portion of the microelectronic device, such that the plurality of regulators can supply relatively independent transient suppression to various portions of the microelectronic device.

In accordance with various additional embodiments of the invention, one or more of the secondary regulators include a programmable integrated circuit. In accordance with one or more aspects of this embodiment, the integrated circuit includes injector control, segmented current switch banks for sinking and/or sourcing current to the microelectronic device, a temperature monitor, a charge well monitor, programmable parameters, a serial interface for configuration, signal generators (e.g., to send signals to a controller) or any combination of these elements.

In accordance with another embodiment of the invention, a power regulation system includes a one or more primary regulators, one or more secondary regulators coupled to one or more primary regulators, and a controller coupled to one or more of the secondary regulators and optionally to one or more of the primary regulators. In accordance with one aspect of this embodiment, a system includes a plurality of primary regulators and each primary regulator is coupled to a different portion of a microelectronic device. In accordance with another aspect of this embodiment, two or more of the plurality of primary regulators are configured to provide different levels of power to the different portions of the microelectronic device. In accordance with yet a further aspect of this embodiment, the controller is configured to receive a signal indicative of a transient event and drive one or more of the primary regulator in response to the sensed transient event.

BRIEF DESCRIPTION OF THE DRAWINGS

A more complete understanding of the present invention may be derived by referring to the detailed description, considered in connection with the figures, wherein like reference numbers refer to similar elements throughout the figures, and.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF EXEMPLARY EMBODIMENTS

The present invention is described herein in terms of various functional components and various processing steps. It should be appreciated that such functional components may be realized by any number of hardware or structural components configured to perform the specified functions. For example, the present invention may employ various integrated components comprised of various electrical devices, e.g., resistors, transistors, capacitors, diodes and the like, whose values may be suitably configured for various intended purposes. In addition, the present invention may be practiced in any integrated circuit application where signal serial bus control schemes are employed. Such general applications that may be appreciated by those skilled in the art in light of the present disclosure are not described in detail. Further, it should be noted that while various components may be suitably coupled or connected to other components within exemplary circuits, such connections and couplings can be realized by direct connection between components or by connection through other components and devices located therebetween.

The present invention provides electrical routing schemes for providing electrical signals to a plurality of electrical components. While the invention may be practiced in connection with a variety of electrical components, the invention is conveniently described in connection with power regulation circuits and systems.

Figure 1:
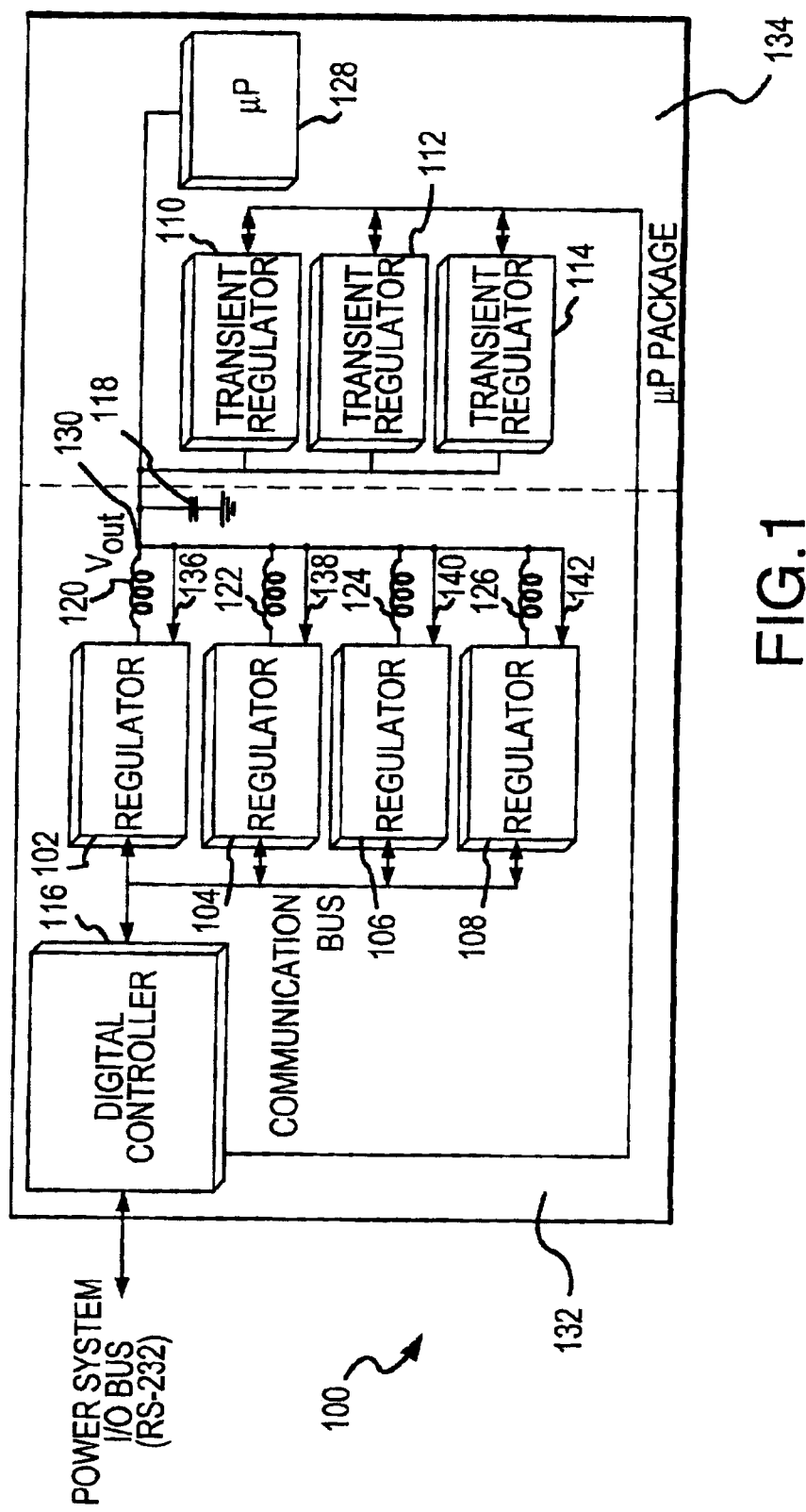
FIG. 1 illustrates a power regulation system in accordance with an exemplary embodiment of the present invention.

FIG. 1 illustrates a power regulation system 100 in accordance with exemplary embodiments of the present invention. As described in more detail below, the present invention provides a control bus scheme to enable communication between various portions of system 100.

System 100 includes primary power regulators 102–108, transient suppression regulators 110–114, and a controller 116. System 100 may also suitably include one or more capacitors 118 and one or more inductors 120–126 coupled to a load 128. The capacitors and inductors may comprise discrete components and/or may symbolize inherent inductance and capacitance within system 100. Although exemplary system 100 is illustrated with four primary regulators 102–108, three transient regulators 110–114, four inductors 120–126, and one capacitor 118, power regulation systems in accordance with the present invention may include any suitable number of primary regulators, transient suppression regulators, inductors, and capacitors. Furthermore, power regulation systems in accordance with the present invention may include additional components, such as resistors, transistors, additional capacitors and/or inductors, and the like, which are not illustrated in the drawing figures.

In operation, system 100 provides operating power to a microprocessor 128 and also responds to transient events caused by the operation of microprocessor, e.g., a power surge due to, for example, multiple gates with the microprocessor switching in the same direction at about the same time or from a portion of the microprocessor powering up or down. More specifically, operating power and low-frequency (e.g., less than about 100 kHz) transient suppression power is supplied to microprocessor via regulators 102–108 and transient suppression regulators 110–114 supply high-frequency (e.g., greater than about 100 kHz) transient suppression power to the power supply circuit. As discussed in more detail below, regulators 102–108 may be configured to alter operation to respond to actual or predicted transient events and transient suppression regulators 110–114 may be configured to supply power in response to actual or predicted transient power demands from the microprocessor, such that any spikes or droops that would otherwise occur on the power circuit are reduced or eliminated.

As noted above, primary regulators 102–108 are configured to provide nominal operating power to microprocessor 128 and to provide low frequency transient suppression. By way of particular example, regulators 102–108 may be configured to provide about 1.1 volts±about ten percent at about 100 amps±ten percent to microprocessor 128 and respond to transient events occurring at less than about 100 kHz. However, regulators having other output voltages and current levels are within the scope of the present invention.

Regulators 102–108 may be configured in a variety of ways, such as, for example, a linear regulator, or a single or multi-phase switching regulator. In accordance with one exemplary embodiment of the invention, regulators 102–108 are three or four phase switching regulators tied to a common voltage node 130, through inductors 120–126. In accordance with alternate embodiments of the inventions regulators 102–108 may be replaced with a single multi-phase switching regulator. An exemplary primary regulator suitable for use with the present invention is described in greater detail in application Ser. No. 09/975,195, entitled SYSTEM AND METHOD FOR HIGHLY PHASED POWER REGULATION, filed Oct. 10, 2001, and application Ser. No. 10/103,980, entitled, SYSTEM, DEVICE AND METHOD FOR PROVIDING VOLTAGE REGULATION TO A MICROELECTRONIC DEVICE, filed Mar. 22, 2002, the contents of which are hereby incorporated herein by reference. Regulators 102–108 may be formed on a single substrate as part of an array or on separate substrates as discrete components. In either case, regulators 102–108 may be coupled to another substrate (e.g., a substrate 132), such as a motherboard or an interposer. In addition, regulators 102–108 may suitably include feedback loops, represented by lines 136–142, to facilitate accurate control of the voltage at node 130. In accordance with one aspect of this embodiment, regulators 102–108 form an array configured to provide about 15 amps or more of power at about 1 MHz switching speed.

Transient regulators 110–114 may also be configured in a variety of ways in accordance with various embodiments of the invention. In general, regulators 110–114 are configured to quickly respond to fast, high frequency power demands. In other words, secondary regulators 110–114 are configured to reduce power spikes or droops in system 100 by providing or sinking power in response to transient power events. In accordance with various embodiments of the invention, regulators 110–114 are configured to sink and/or source current in response to a signal indicative of a transient response. In accordance with other aspects of this embodiment each transient regulator 110–114 is configured to independently respond to transient events that occur at one or more portions of microprocessor 128.

Figure 2:
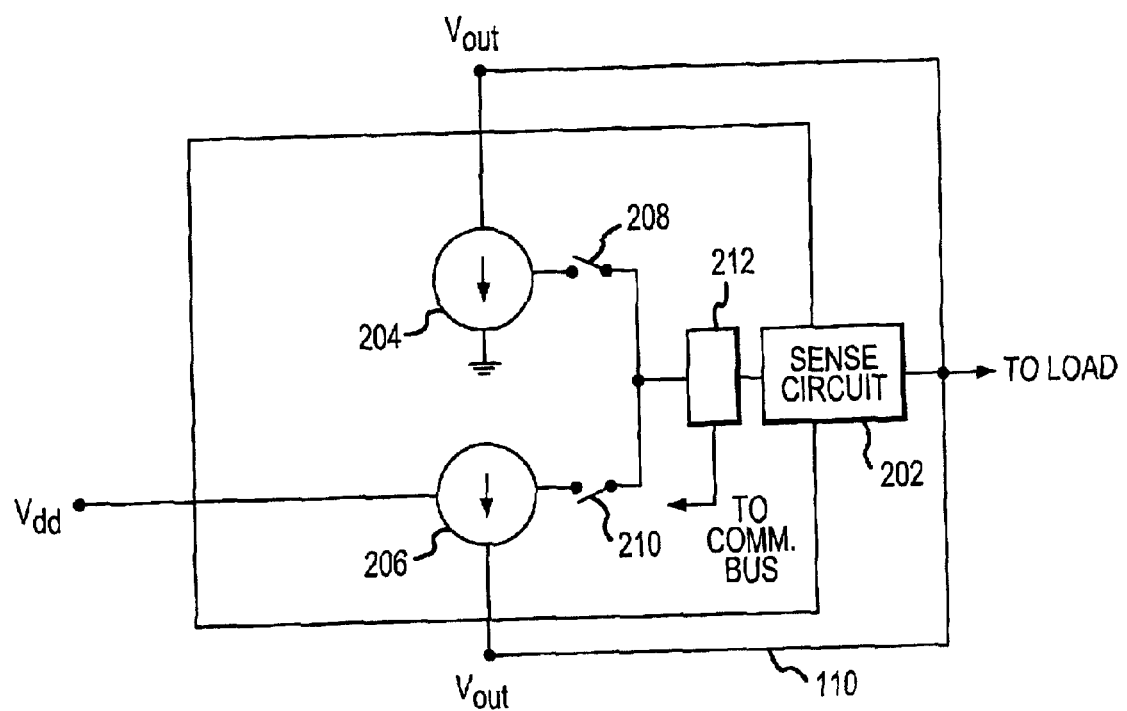
FIG. 2 illustrates an exemplary transient suppression regulator including a sense circuit in accordance with the present invention.

FIG. 2 schematically illustrates a transient power regulator (e.g., regulator 110) in greater detail. In accordance with this embodiment, transient regulator 110 includes a sense circuit 202, a current source 204, a current sink 206, switches 208 and 210, and a controller 212. In operation, a change in power is detected at circuit 202, which sends a corresponding signal to controller 212, which sends a corresponding signal to switches 208 or 210 to short the appropriate portion of the circuit and consequently sink or supply charge in response to the sensed transient power demand.

Sense circuit 202 may be configured in a variety of ways in accordance with various embodiments of the invention. For example, the sense circuit may be configured to sense a change in current, a rate of change of current, a change in voltage, a rate of change of voltage, or any combination thereof. Although illustrated as part of a transient regulator 110, sense circuit 202 may be a discrete component, formed as part of a primary regulator, or formed as an integral part of microprocessor 128. Further, one sense circuit may be used to provide a signal to multiple regulators 110–114. More detailed descriptions of exemplary sense circuits suitable for use in connection with the present invention are described in application Ser. No. 09/945,187, entitled APPARATUS AND SYSTEM FOR PROVIDING TRANSIENT SUPPRESSION POWER REGULATION, filed Aug. 31, 2001 and application Ser. No. 10/147,156, entitled METHOD AND APPARATUS FOR PROVIDING WIDEBAND POWER REGULATION TO A MICROELECTRONIC DEVICE, filed May 15, 2002, the contents of which are herein incorporated by reference.

Charge sources 204, 206 and switches 208, 210 may also be formed in a variety of configurations. For example, switches 208 and 210 may be formed using transistors (e.g., field effect or bipolar transistors), and charge sources 204, 206 may be formed using additional transistors. Exemplary circuits suitable for use as transient suppression regulators, which may also include a sense circuit, are described in greater detail in application Ser. No. 09/945,187 and application Ser. No. 10/147,156.

In accordance with an exemplary embodiment of the present invention, digital controller 116 is configured to drive one or more regulators 102–108 and 110–114. Controller 116 may be further configured to receive a signal from circuit 202 and send information to one or more regulators 102–108 based on the received signal. By way of example, circuit 202 may send a signal, indicating that a transient event has been detected, to controller 116. In this case, controller 116 in turn sends a signal to one or more primary regulators 102–108 to cause the regulators to alter output in response (e.g., to change operating mode to provide current to the microprocessor at a higher rate) to the sensed transient event. Controller 116 may also be configured to provide protection against excessive currents, excessive transient response activity, faults, and the like.

Controller 116 may be configured as an analog or digital controller. In accordance with one exemplary embodiment of the invention, controller 116 is a digital controller, which includes system monitoring devices. A more detailed description of a controller suitable for use with the present invention is described in application Ser. No. 10/103,980, entitled SYSTEM AND METHOD TO MAINTAIN VOLTAGE REGULATION DURING RAPID LOAD CHANGES IN VOLTAGE REGULATOR MODULES, filed Mar. 22, 2002.

Figure 3:
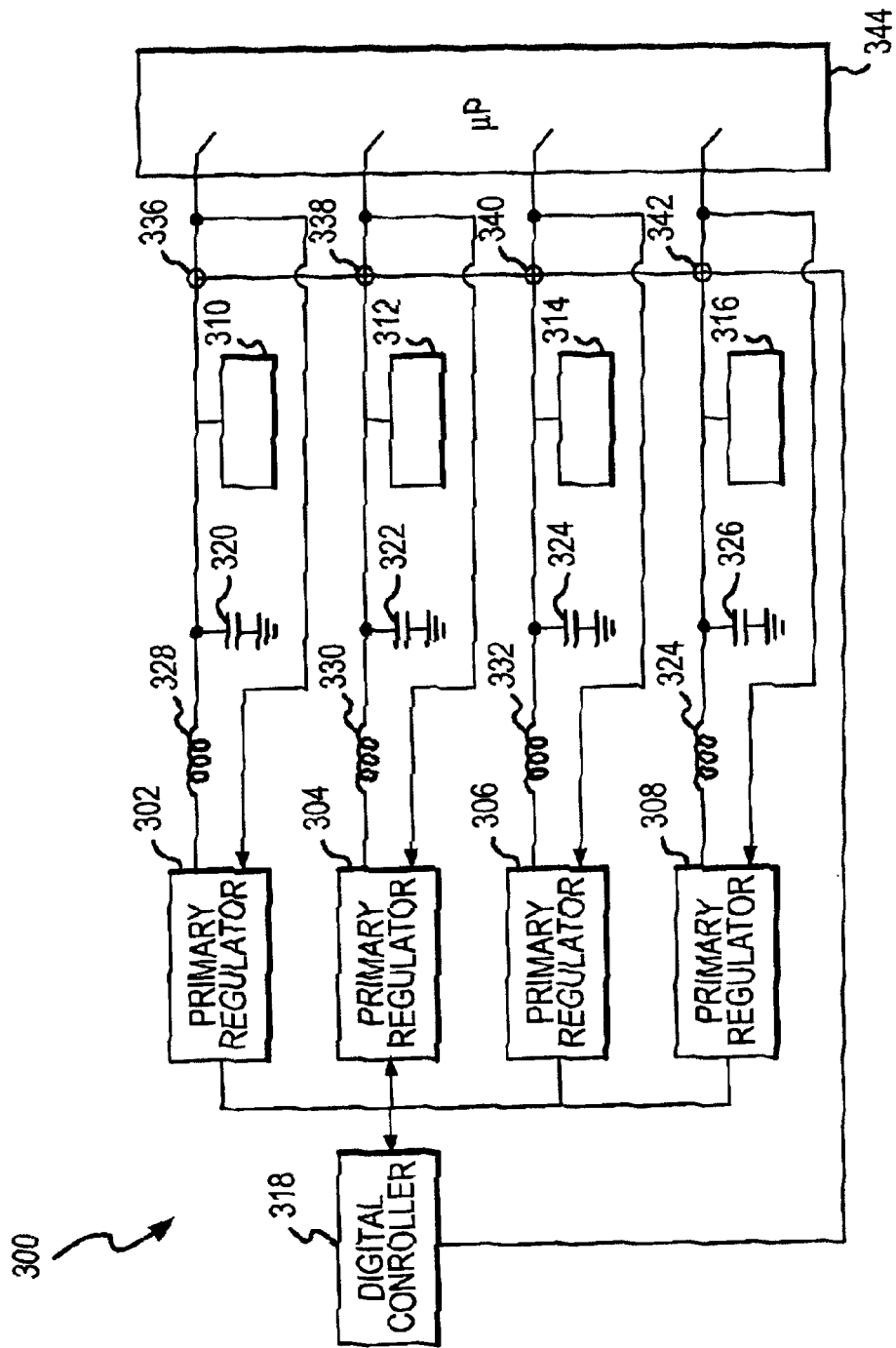
FIG. 3 illustrates a power regulation system in accordance with an alternate embodiment of the invention.

FIG. 3 illustrates a power regulation system 300 in accordance with another exemplary embodiment of the invention. System 300 includes primary regulators 302–308, transient suppression regulators 310–316, a controller 318, capacitors 320–326, inductors 328–334, and sense circuits 336–342, coupled to a microprocessor 344. System 300 is similar to system 100, except system 300 is configured to supply independently controlled operating power to a plurality of locations on microprocessor 344. In accordance with various aspects of this embodiment, each primary regulator 302–308 is configured to provide independently controlled power to an independent or isolated portion of microprocessor 344. An independent portion of microprocessor 344 may include, for example, a group of related processor units for. power delivery purposes (e.g., floating point unit memory unit, input/output unit, or the like) separated from other units or portions using suitable dielectric material and power grid formation techniques. Alternatively or in addition to providing power to various units of the microprocessor, the microprocessor may be divided into spacial portions, and power may be independently supplied to the spatial portions of the microprocessor using a plurality of regulators 302–308. By providing power to various units and/or portions of the microprocessor, system 300 is able to quickly respond to changes in power demands, e.g., to transient events, and system 300 may be configured to tailor supplied power according to the operation of portions and/or units of the microprocessor, rather than supplying one operating voltage to the entire microprocessor. In addition, each regulator 302–308 may be independently powered up or down, depending on operating conditions of a portion of the microprocessor, rather than based on operating conditions of the entire microprocessor.

Power regulators 302–308 may be configured as any of regulators 102–108 described above. In accordance with one embodiment of the invention, regulators 302–308 are switching regulators and at least one of regulators 302 is a multi-phase switching regulator. In accordance with one aspect of this embodiment, one or more regulators 302–308 are configured such that the output of at least one of the regulators differs from the output of other regulators, such that power supplied to one portion of microprocessor 344 differs from power, supplied to another portion of the microprocessor.

Similarly, transient suppression regulators 310–316 may include any combination of the transient suppression regulators 110–114 described above in connection with FIG. 1. In accordance with one embodiment of the invention, each regulator 302–308 is coupled in parallel with a corresponding transient regulator 310–316. However, in accordance with other embodiments of the invention, one or more regulators 302–308 may not be coupled to a transient suppression regulator and one or more regulators 302–308 may be coupled, in parallel, to a plurality of transient regulators. In accordance with other embodiments of the invention, one or more transient suppression regulators may be powered by yet another power source such as an unregulated power supply (e.g., an alternating current/direct current converter).

Sense circuits 336–342 may comprise any one or more of the sense circuits described above in connection with sense circuit 202, illustrated in FIG. 2. In accordance with one exemplary embodiment, at least one sense circuit 336–342 includes a di/dt sense circuit configured to quickly detect a transient event and send a corresponding signal to one or more transient suppression regulator 310–316 and optionally to controller 318. Although illustrated with four sense circuits, power regulation systems in accordance with the present invention may include any desired number and any desired combination of configurations of sense circuits. For example, a system may include only one sense circuit that communicates with a plurality of transient suppression regulators and optionally to a controller.

In accordance with an alternate embodiment of the invention, microprocessor 344 may be configured to supply a predictive signal indicative of occurrence of a likely transient event. A microelectronic device and system including a device with a predictive signal generator is described in detail in application Ser. No. 10/104,227 entitled METHOD, APPARATUS & SYSTEM FOR PREDICTIVE POWER REGULATION TO A MICROELECTRONIC CIRCUIT and filed Mar. 21, 2002, the contents of which are hereby incorporated by reference.

Similar to controller 116, controller 310 is generally configured to drive one or more regulators 302–308 and 310 and to receive a signal from one or more sense circuits 336–342 and send a corresponding signal to one or more primary regulators 302–308 to cause one or more of the regulators to temporarily alter an operating condition in response to the sensed transient event. Controller 318 may be further configured to power up, power down, or alter operating parameters such as duty cycle and the like of one or more regulators 302–308 in response to a sensed operating conditions or other suitable signal.

Figure 4:
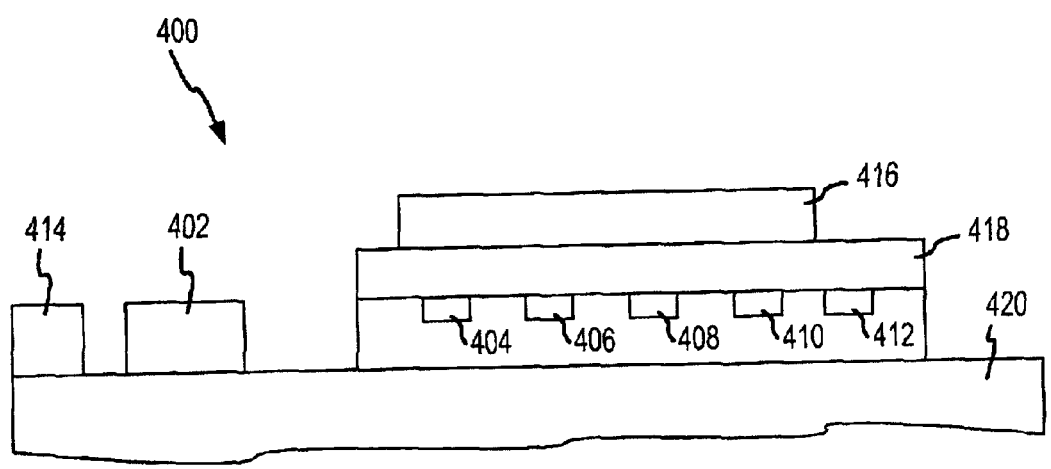
FIG. 4 illustrates, in cross-section, a power regulation system in accordance with a further exemplary embodiment of the invention.

FIG. 4 schematically illustrates a power regulation system 400, including a primary regulator 402, a plurality of transient suppression regulators 404–412, and a controller 414 coupled to a microprocessor 416. In accordance with the exemplary illustrated embodiment, transient suppression regulators 404–412 are coupled (e.g., using bump technology) to a substrate 418 such multi-layered fire-resistant printed circuit board, to which microprocessor 416 is also coupled (e.g., using bump technology). In accordance with other embodiments of the invention, regulators 404–412 may be attached to the microprocessor using Bumpless Build-Up Layer (BBUL) technology. In accordance with yet another embodiment of the invention, regulators 402 and 404–412 may be packaged together and coupled either directly or indirectly to the microprocessor.

In further accordance with embodiment illustrated in FIG. 4, primary regulator 402 is coupled to a second substrate 420 such as another printed circuit board (e.g., a mother board of a computer system) and is coupled to microprocessor 416 and to at least one of regulators 404–412. Alternatively, regulators 404–412 may be coupled to another power source. Forming or attaching regulator 402 to a second substrate may be advantageous because any heat generated by the regulator may be more easily dissipated and is less likely to affect performance of microprocessor 416.

Although illustrated as a separate component, controller 414 (or controllers 116, 318) may suitably be integrated with any of microprocessor 416, secondary regulators 404–412, or primary regulator 402. In accordance with one exemplary embodiment of the invention, controller 414 is a discrete circuit coupled to primary regulator 402 and a sense circuit (not illustrated, which may be formed as part of any of regulators 404–412 as described above) and/or to microprocessor 414 using conductive layers on or within substrate 420.

Figure 5:
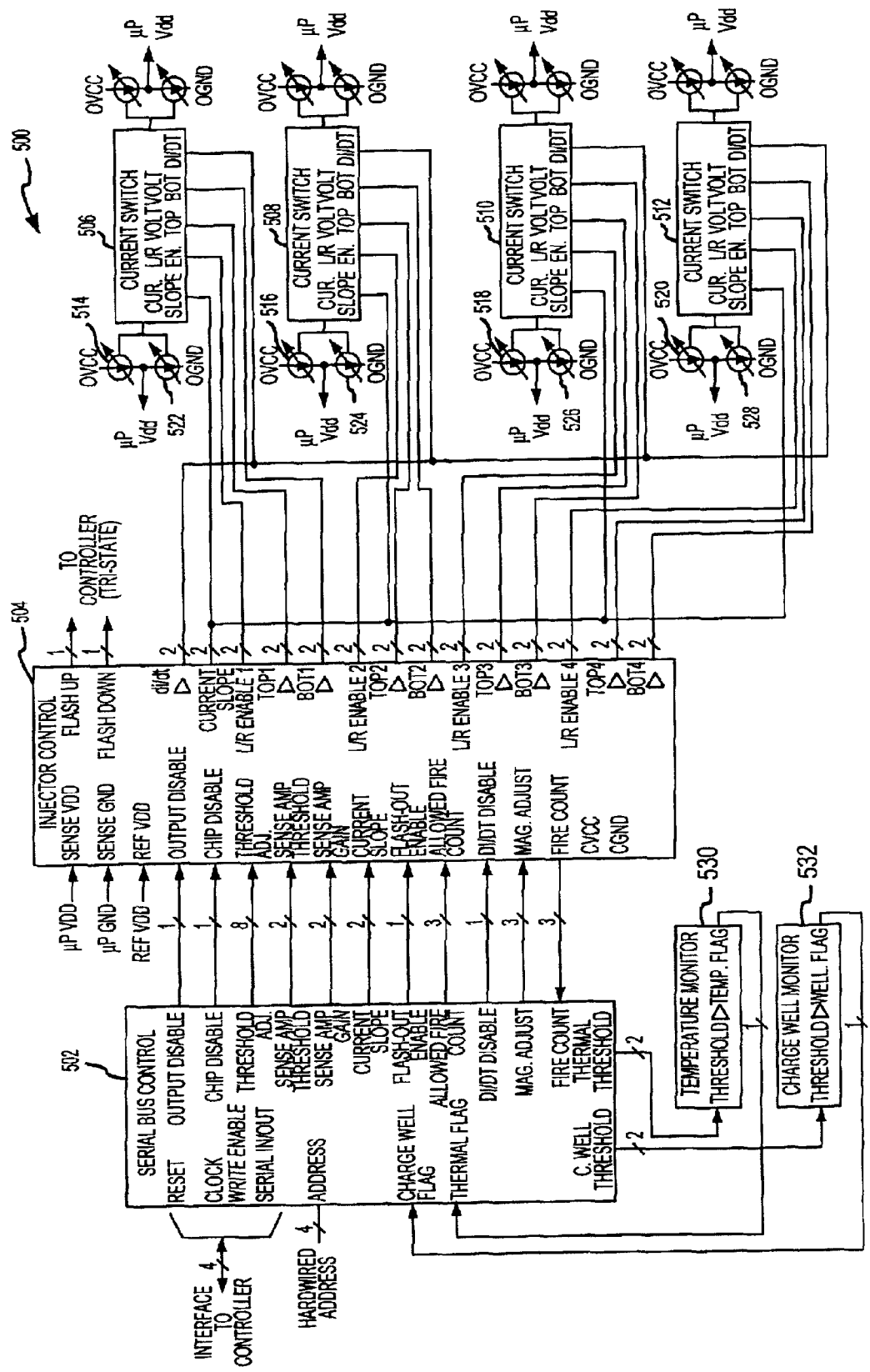
FIG. 5 illustrates a transient suppression regulator in greater detail.

FIG. 5 illustrates an exemplary block diagram of a secondary regulator 500, including temperature monitoring, charge well monitoring, and hand-off signal capability to allow transient response from both a primary regulator and a secondary regulator, in accordance with the present invention. Regulator 500 includes a serial bus control portion 502, an injector control portion 504, switches 506–512, current sources 514–520, current sinks 522–528, a temperature monitor 530, and a charge well monitor 532.

In accordance with one aspect of the secondary regulator illustrated in FIG. 5, di/dt sensing is only used for high-side compensation (when current is to be provided to suppress a transient event) and voltage comparison is used for both high-side and low-side compensation. The voltage comparators are preferably configured with a "dead zone", hysteretic comparators, and asymmetric thresholds that are optimized for undervoltage control, and preferably include multiple threshold levels.

Figure 6:
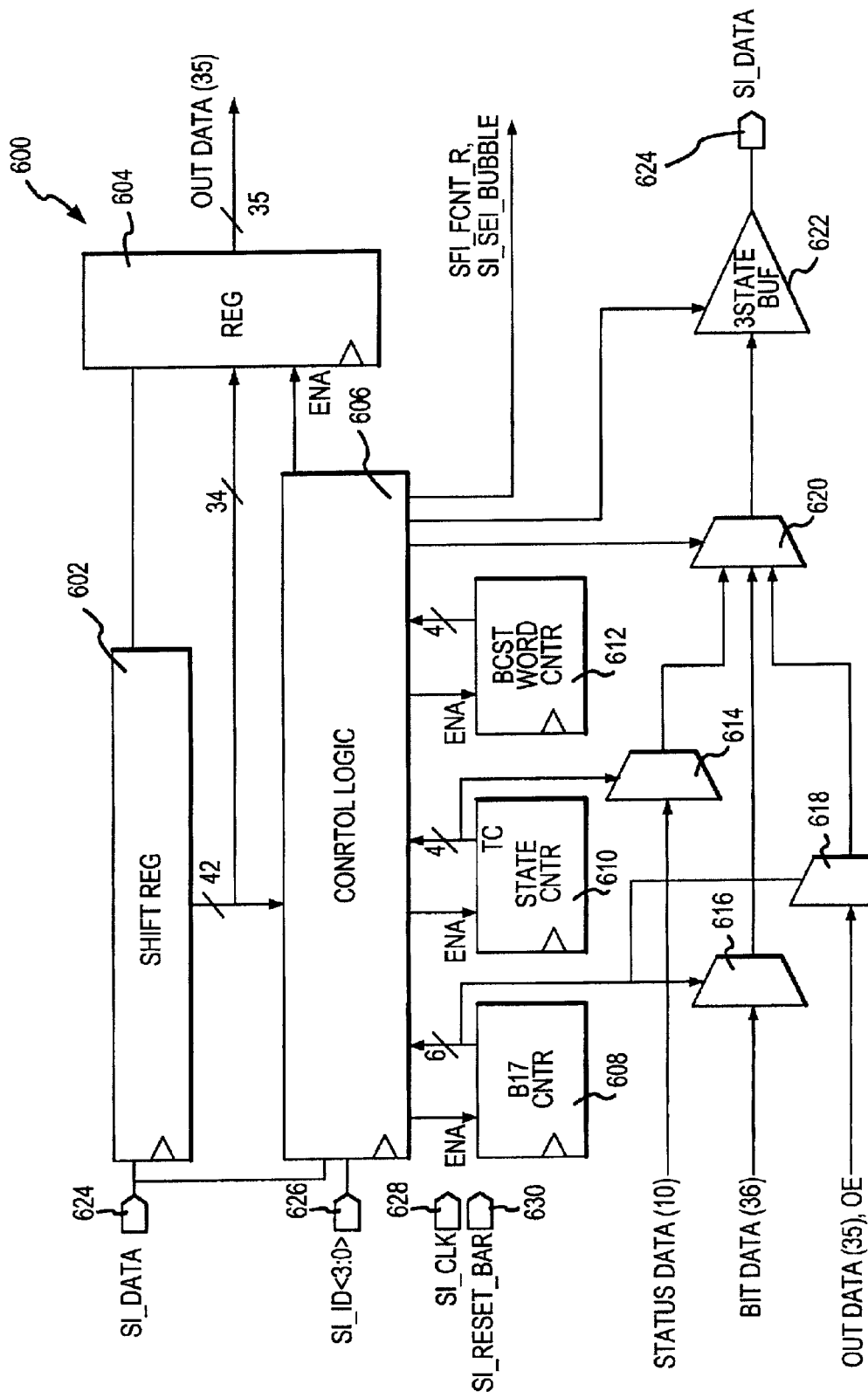
FIG. 6 illustrates a serial interface circuit for use with a secondary regulator of the present invention.

FIG. 6 illustrates a serial bus control interface 600 for driving one or more secondary regulators such as regulator 500. In accordance with the present invention, interface 600 receives a serial signal from a controller such as controller 116 and alters regulator 500 operation and/or sends information back to controller 116 in response to the received signal. In other words, controller 116 operates as a master and the secondary regulator(s) act as a slave in the illustrated control scheme.

Interface 600 includes a shift register 602, a register 6W, control logic 606, a bit counter 608, a state counter 610, a broadcast word counter 612, multiplexers 614–620, a tri-state buffer 622, a data input/output node 624, an ID node 626, clock input 628, and reset bar input 630. Data is transmitted between the master controller and interface 600 using two transmission lines: one dedicated to clock signals (which are input into components 602–622) and one dedicated to two-way data transmission between the master controller and interface 600 (which is input/output at node 624). The clock signals are transmitted in the direction of master controller to slave and the data is transmitted in two directions—from master to slave and from slave to master.

In operation, serial information is received at node 624 and sent to both shift register 602 and control logic 606. The shift register is configured to receive the serial data and transform the data into parallel data for processing within interface 600. Control logic 606 determines when to read information, when to store the received data in register 604 and to enable counters 608–612 at the proper times. Output data from register 604 is transmitted to multiplexer 618 to be placed in serial format before the data is transmitted back to the master controller.

Counters 608–612 are used to selected desired bits at desired time, and when combined with multiplexers 614–620, to transform parallel information to serial information. In particular, bit counter 608 is used to used to select one bit at a time from either the data stored in register 604 or from other data used for built-in testing during a read process, state counter 610 is configured to select one bit at a time from a status register, and broadcast word counter 612 is configured to determine when to send data back on a read broadcast, as discussed in more detail below.

Multiplexers 614–620 are configured to receive information from multiple sources and place the information in serial format for transmission back to the master controller. The information from multiplexers 614–620 is transmitted to tri-state buffer 622, which has three operational states: high, low, and not being driven. Buffer 622 is configured to ensure that information is sent in only one direction at any give time.

Information written to and received from interface 600 is in the form of multi-bit words. In accordance with one exemplary embodiment of the invention, each word begins with a 4-bit address, followed by a 2-bit mode identifier, followed by either enable or data information. Table 1 below illustrates mode, function and corresponding number of enable or data bits for various exemplary functions of interface 600.

TABLE 1

| Mode | Bit Function | Number of Enable or Data Bits |
|---|---|---|
| Single Output Enable | 10 reset output enable bit for one secondary regulator | 1 |
| Broadcast Output Enable | 10 reset all secondary regulators | 1 |
| Single Write Data | 11 control all command bits for a single secondary regulator | 36 |
| Broadcast Write data | 11 control all command bits for all secondary regulators | 36 |
| Single Read Status | 00 read status word from a single secondary regulator | 10 |
| Broadcast Read Status | 00 read status word from all secondary regulators | 10 bits for each secondary regulator |
| Single Read Data | 01 read a data word from a single secondary regulator that was written to the secondary regulator | 36 |

As noted above, the first four bits of a transmitted word are dedicated to secondary regulator address information, allowing for 16 distinct addresses. In accordance with one exemplary aspect of this embodiment of the invention, up to 15 addresses are dedicated to individual secondary regulators and one address, e.g., "1111" is dedicated to broadcast mode.

Single output enable and broadcast output enable functions are used to set or reset the output enable bit to activate one or all of the transient regulators, respectively. Single write data and broadcast write data are used to write information to a register for one or all of the secondary regulators and to reset the enable bit of the respective regulator(s).

Single output enable and broadcast output enable functions are used to set or reset the output enable bit to activate one or all of the transient regulators, respectively. Single write data and broadcast write data are used to write information to a register for one or all of the secondary regulators and to reset the enable bit of the respective regulator(s).

Single read status and broadcast read status functions are used to read information from one or all of the secondary regulators. In accordance with one embodiment of the invention, the transmitted information includes a wait period—e.g., two bits or two clock cycles, to ensure that sequential data does not overlap. After the designated period expires, the slave secondary regulator transmits the requested information to the master controller. In the case of a broadcast read, the slave secondary regulators respond sequentially in a time slot that depends on their address, and there is a high impedance state or wait period between transmission from each secondary regulator. For example, when the wait period is two clock cycles, the first valid information for secondary regulator n+1 occurs two clock cycles after information from regulator n has been read. Exemplary words for single read status and broadcast read status are presented below.

Single Read Status

| Addr[3:0] | Mode[1:0] | Hi-z | Slave status[9:0] |
|---|---|---|---|
| 4 bits, MSB first | 2 bits, MSB first 00 | 2 bit | 10 bits, MSB first |

Broadcast Read Status

| Addr[3:0] | Mode[1:0] | Hi-z | Slave 0 status[9:0] | Hi-z | Slave n status[9:0] |
|---|---|---|---|---|---|
| 4 bits, MSB first 1111 | 2 bits, MSB first 00 | 2 bit | 10 bits, MSB first | 2 bit | 10 bits, MSB first |

Finally, a single read data function can be used to read information that was written to a particular secondary regulator. A word for the single read data function is similar to the word for single read status, except that the information field is 36 bits in length, rather than 10 bits. As noted above, when a slave secondary regulator receives a request for information from the master controller, the secondary regulator waits for a period of time (e.g., two clock cycles or bits) and then transmits the requested information.

Figure 7:
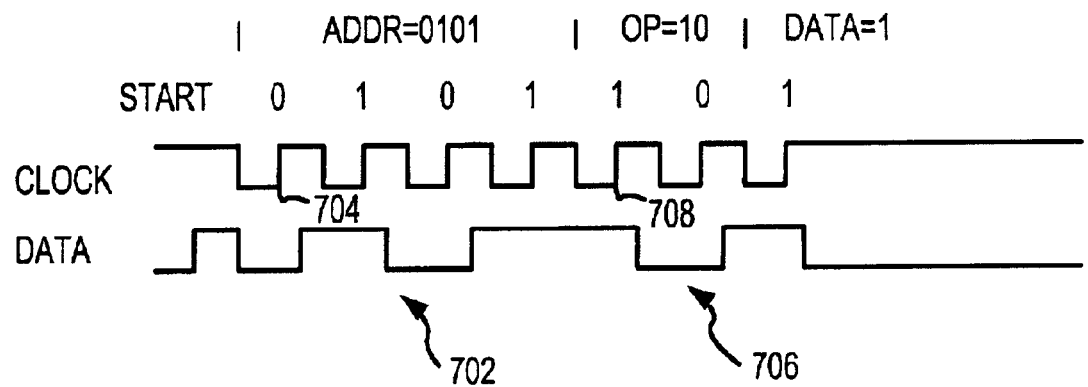
FIGS. 7 and 8 illustrate data timing diagrams for data transmission in accordance with the present invention.
Figure 8:
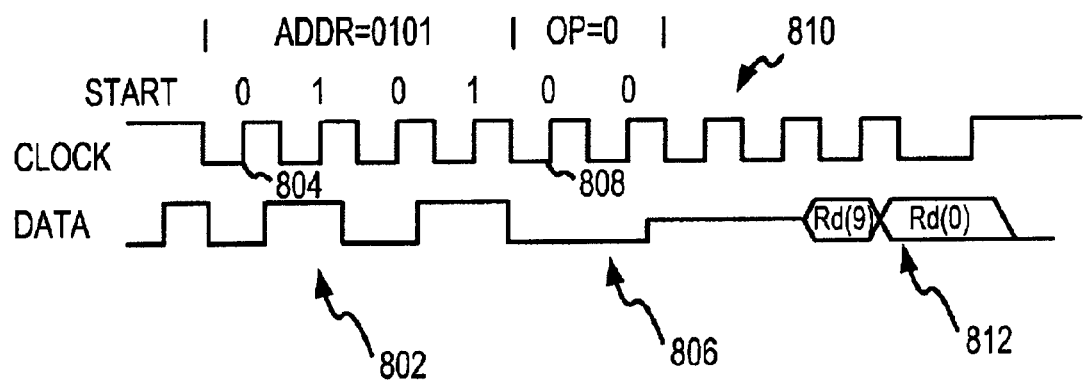

FIGS. 7 and 8 illustrate timing of write output enable and read status operations, respectively. In accordance with the exemplary examples of the invention, interface 600 samples data on the rising edge of the serial clock signal, and the master controller, when reading information sent from one or more secondary regulators, also reads information using a rising edge of the clock signal.

As illustrated in FIG. 7, address information 702 is read beginning at time 704, when the clock signal is on the rise. Address information 0101 indicates that the information is to be written to a specific secondary regulator, e.g., the 5th regulator, rather than all secondary regulators (in which case the address would be "1111"). A mode 706 is then read at time 708. Based on the mode, the control logic knows how many bits following the mode information to consider. In this case, mode "10" indicates a write enable and interface 600 considers only the following bit, which in the illustrated case is "1."

The read status operation illustrated in FIG. 8 operates in much the same manner. Address information 802 is initially read at time 804, followed by mode information 806 at time 808. In this case, mode "00" indicates a read operation from one secondary regulator (because the address is not "1111"). As illustrated, after mode information 806 is read by the slave controller, about 2 clock cycles 810 pass before information 812 is transmitted to the master controller.

Referring again to FIG. 6, interface 600 optionally includes the ability to perform a built-in test and/or the ability to check status. An exemplary built in test word includes bits 0–7 for thermometer decode, bits 8–11 for bottom voltage comparator resent on read (widest to nearest), bits 12–15 for top voltage comparator resent on read (widest to nearest), bits 16–18 for charge well comparators, bits 19–21 for temperature comparators, and bit 22 for a fire counter panic flag, and allows 36 total bits for the built-in test. An exemplary status word includes 10 bits, which are assigned as follows: bit 0 for temperature status, bit 1 for charge well status, and bits 2–9 for fire counter status.

It should be appreciated that the particular implementations shown and described herein are illustrative of various embodiments of the invention including its best mode, and are not intended to limit the scope of the present invention in any way. Indeed, for the sake of brevity, conventional techniques for signal processing, data transmission, signaling, and network control, and other functional aspects of the systems (and components of the individual operating components of the systems) may not be described in detail herein. Furthermore, the connecting lines shown in the various figures contained herein are intended to represent exemplary functional relationships and/or physical couplings between the various elements. Many alternative or additional functional relationships or physical connections may be present in the power regulation systems of the present invention.

The present invention has been described above with reference to exemplary embodiments. Those skilled in the art having read this disclosure will recognize that changes and modifications may be made to the embodiments without departing from the scope of the present invention. For instance, the present invention has been described in connection with particular words for digital data transmission; however various other words may suitably be used to transmit information in accordance with the present invention. These and other changes or modifications are intended to be included within the scope of the present invention, as expressed in the following claims.

We claim:

1. A system for transmitting signals between a master controller and a secondary regulator, the system comprising:
   a master controller;
   a primary regulator coupled between the master controller and a load to provide low frequency power regulation;
   a communication bus coupled to the master controller; and
   a secondary regulator, including a serial interface, coupled to the communication bus and the master controller, wherein the secondary regulator is configured to receive information from the master controller and to transmit information to the master controller and to suppress high speed transients.

2. The system of claim 1, wherein the communication bus comprises two transmission lines.

3. The system of claim 2, wherein the communication bus comprises a clock transmission line and a data transmission line.

4. The system of claim 1, further comprising a plurality of secondary regulators coupled to the communication bus.

5. The system of claim 1, wherein the serial interface is configured to receive serial information, transform the serial information to parallel information, process the parallel information, and transmit serial information to the master controller.

6. The system of claim 1, wherein the serial interface comprises a shift register, a register, and control logic.

7. The system of claim 6, wherein the serial interface further includes a bit counter and a plurality of multiplexers.

8. The system of claim 1, wherein the interface is configured to run a built-in test operation.

9. The system of claim 1, wherein the interface is configured to run a status check operation.

10. The system of claim 1, wherein the interface includes a tri-state buffer configured to select one of three possible states of output data.

11. The system of claim 1, wherein the master controller and the secondary regulator are configured to communicate using a digital word having the first four bits dedicated to an address the secondary regulator.

12. The system of claim 1, wherein the master controller and the secondary regulator are configured to communicate using a digital word having two bits dedicated to the mode of operation.

13. The system of claim 1, wherein the master controller and the secondary regulator are configured to communicate using a digital word having ten bits dedicated to slave status.

14. The system of claim 1, wherein the master controller and the secondary regulator are configured to communicate using a digital word having thirty-six bits dedicated to slave data.

15. The system of claim 1, wherein the interface is configured to read information during a rise of a clock signal.

16. The system of claim 1, wherein interface write information transmitted from the master controller to the secondary regulator comprises information selected from the group consisting of: output enable output enable, threshold adjust, magnitude adjust, output current pulse slope, output current pulse slope, sense amp gain, sense amp threshold, thermal shutdown threshold, charge well trip level, flash out enable, allowed fire count, force comparator on, test mode, di/dt bank duration, charge well sense locale, and output switch state.

17. A method of communicating between a master controller and a secondary regulator, the method comprising the steps of:
providing a master controller;
providing at least one primary controller to provide low frequency power regulation,
providing a plurality of secondary regulators to suppress high speed transients, wherein each regulator comprises a slave controller; and
transmitting digital information between the master controller and the secondary regulator.

18. The method of claim 17, wherein the step of transmitting information comprises providing a digital word having the first four bits dedicated to the address for the secondary regulator.

19. The method of claim 17, wherein the step of transmitting information comprises providing a digital word having two pits dedicated to the mode of operation.

20. The method of claim 17, wherein the step of transmitting information comprises providing a digital word having ten bits dedicated to slave status.

21. The method of claim 17, wherein the step of transmitting information comprises providing a digital word having thirty-six bits dedicated to slave data.

22. The method of claim 17, further comprising the step of reading information transmitted from the master controller during a rise of a clock signal.

23. The method of claim 17, further comprising the step of writing information to a portion of the secondary regulator.

24. The method of claim 23, wherein the step of writing comprises writing information selected from the group consisting of: output enable output enable, threshold adjust, magnitude adjust, output current pulse slope, output current pulse slope, sense amp gain, sense amp threshold, thermal shutdown threshold, charge well trip level, flash out enable, allowed fire count, force comparator on, test mode, di/dt bank duration, charge well sense locale, and output switch state.

25. A system for transmitting signals between a master controller and a secondary regulator, the system comprising:
a master controller;
a primary regulator coupled between the master controller and a load to provide low frequency power regulation,
a communication bus coupled to the master controller; and
a secondary regulator, including a serial interface, coupled to the communication bus and the master controller to suppress high speed transients,
wherein the master controller and the serial interface communicate using a protocol that supports write, broadcast write, output enable, broadcast output enable, read status, broadcast read status, and read command.

* * * * *